United States Patent [19]
Erickson

[11] Patent Number: 6,108,794
[45] Date of Patent: Aug. 22, 2000

[54] SIGNAL COMPARISON SYSTEM AND METHOD FOR IMPROVING DATA ANALYSIS BY DETERMINING TRANSITIONS OF A DATA SIGNAL WITH RESPECT TO A CLOCK SIGNAL

[75] Inventor: Bruce A. Erickson, Colorado Springs, Colo.

[73] Assignee: Agilent Technologies, Palo Alto, Calif.

[21] Appl. No.: 09/034,144

[22] Filed: Feb. 24, 1998

[51] Int. Cl.[7] ............................................. G06F 1/12
[52] U.S. Cl. ............................................. 713/401; 713/503
[58] Field of Search ................................. 713/400, 401, 713/500, 501, 503, 600

[56] References Cited

U.S. PATENT DOCUMENTS

| | | | |
|---|---|---|---|
| 5,229,668 | 7/1993 | Hughes, Jr. et al. | 327/271 |
| 5,467,464 | 11/1995 | Oprescu et al. | 713/400 |
| 5,692,165 | 11/1997 | Jeddeloh et al. | 713/400 |
| 5,933,623 | 8/1999 | Umemura et al. | 713/401 |

*Primary Examiner*—Dennis M. Butler

[57] ABSTRACT

A signal comparison system determines whether a data signal is transitioning close to transitions of its clock signal, thereby causing possible errors in the sampling of the data signal. A first latch latches a data value of the data signal based on the transition of the clock signal. A delay mechanism delays the clock signal so that a second latch receives a delayed transition of the clock signal. The amount of delay corresponds to an amount of time to allow at least the data value latched into the first latch to stabilize. The second latch latches a data value of the data signal based on the delayed transition of the clock signal. A comparison mechanism compares the values of the two latches and outputs a particular logical value when the two values differ. The particular logical value indicates that the data signal transitioned so close to the clock signal that the data value of the first latch may be unreliable. Control logic increases a delay of the data signal until the particular logical value is detected. The control logic then decreases the delay of the data signal until the particular logical value is again detected. By setting the delay of the data signal to a position in the middle of the two delays that result in a detection of the particular logical value, more reliable communication is established by minimizing timing errors associated with the data signal transitioning close to transitions of the clock signal.

29 Claims, 6 Drawing Sheets

SIGNAL COMPARISON SYSTEM AND METHOD FOR IMPROVING DATA ANALYSIS BY DETERMINING TRANSITIONS OF A DATA SIGNAL WITH RESPECT TO A CLOCK SIGNAL

FIELD OF THE INVENTION

The present invention generally relates to computer systems and, in particular, to a signal comparison system and method for improving data analysis by determining when transitions of a data signal occur with respect to transitions of a clock signal.

BACKGROUND OF THE INVENTION

As known in the art, data within a computer system is typically sampled with respect to a system clock signal. For example, a data signal may be sampled at the occurrence of every rising edge of a clock signal. When the data signal is synchronized with respect to the clock signal, the clock signal is designed to produce one sample for each bit of the data signal (e.g., a rising edge of the clock signal occurs once for every bit of the data signal). Accordingly, each bit of the data signal is reliably sampled and used by the computer system to perform various functionality.

Ideally, transitions of the clock signal do not occur close to transitions of the data signal. If a data signal transitions too close to the occurrence of a clock transition, then the data may be in a transition state when the data signal is sampled, thereby causing the data to become unreliable. Furthermore, small timing variations can cause the clock transition to actually skip a bit of data and to prematurely sample the next bit of data. Therefore, great care is usually taken to keep transitions of clock signals sufficiently separated from transitions of corresponding data signals in order to ensure data reliability.

Unfortunately, sufficient separation of data signal transitions and clock signal transitions cannot always be ensured. Errors in generating data signals and clock signals as well as delays in processing data signals and clock signals cause the transitions of the two signals to fluctuate with respect to one another such that data signal transitions may occur too close to clock signal transitions to ensure reliable data. Therefore, there exists a need for a system or method of determining when data clock transitions occur with respect to clock signal transitions. This is especially true in systems that receive data signals and clock signals from external sources such as logic analyzers, for example.

Logic analyzers analyze data generated within a computer system or other digital systems in order to determine errors within the data. Therefore, logic analyzers receive data from the system under analysis and sample the data in relation to an external clock signal also received from the system. It is desirable for the logic analyzer to ensure that transitions of the received clock signal are not occurring too close to transitions of the received data signal. Otherwise, timing errors could occur, thereby corrupting the analysis of the data.

Many prior art systems test for adequate separation of data signal transitions and clock signal transitions by having the system under analysis transmit a predetermined data signal for calibration. In this regard, the sampled data is compared to the predetermined data to determine whether the two match. If the two data signals match, then it is assumed that there is adequate separation of the transitions of data and clock signals. However, if the two data signals do not match, then the timing of the two signals is adjusted and the data is then retested. This process is continued until the two signals match.

Not only does this prior art method take time to establish an accurate result, but the system under analysis must be able to generate a "known-good" signal. Furthermore, the timing of the clock signal transition with respect to the data signal transition is not actually determined, thereby making it difficult to isolate the source of error when the two data signals do not match.

Thus, a heretofore unaddressed need exists in the industry for providing a signal comparing system and method for determining transitions of a data signal relative to transitions of a clock signal so that timing errors can be detected and prevented.

SUMMARY OF THE INVENTION

The present invention overcomes the inadequacies and deficiencies of the prior art as discussed herein. The present invention provides a system and method for improving data communications by determining when transitions of a first signal occur with respect to transitions of a second signal.

The present invention utilizes a first latch, a second latch, a first delay mechanism and a comparison mechanism. The first latch responds to a transition of a first signal (e.g., a clock signal) in order to latch in a value of a second signal (i.e., a data signal) and to latch out the current value of the first latch. The delay mechanism is designed to delay the transition of the clock signal so that the second latch receives a first delayed transition corresponding to the transition of the clock signal. The second latch responds to the first delayed transition of the clock signal in order to latch in a value of the data signal and to latch out the current value of the second latch. The comparison mechanism compares the values latched out of the first and second latches and outputs a particular logical value when the two values differ. The particular logical value is designed to indicate that a transition of the data signal occurred between transitions of the clock signal and the first delayed transition.

In accordance with another feature of the present invention, a third latch is designed to latch in the output of the comparison mechanism and to latch out a feedback signal to the comparison mechanism in response to another delayed transition of the clock signal. The comparison mechanism is designed to analyze the feedback signal and to output the particular logical value mentioned hereinabove when the feedback signal indicates that the third latch has previously received the particular logical value. The third latch is further designed to clear its data value when a clear signal is received by the third latch.

In accordance with another feature of the present invention, the comparison mechanism includes an exclusive-or gate and an or gate. The exclusive-or gate is designed to output a signal corresponding to the particular logical value when the values latched out of the first and second latches differ. The or gate is designed to output the particular logical value when either the output of the exclusive-or gate or the feedback signal corresponds to the particular logical value.

In accordance with another feature of the present invention, control logic is designed to determine whether the data signal has transitioned between a transition of the clock signal and a corresponding first delayed transition. The control logic is then designed to alter the timing relationship of the clock signal with respect to the data signal in order to minimize a number of transitions of the second signal occurring between the transitions of the clock signal and the corresponding first delayed transitions.

The present invention has many advantages, a few of which are delineated hereafter, as mere examples.

An advantage of the present invention is that errors associated with a data signal transitioning close to transitions of a corresponding clock signal can be detected.

Another advantage of the present invention is that the timing of a data signal with respect to a clock signal can be adjusted in order to prevent errors associated with the data signal transitioning close to transitions of the clock signal.

Another advantage of the present invention is that more reliable data communication can be realized by ensuring the accuracy of sampled data signals.

Another advantage of the present invention is that the timing relationship of two signals can be tested and improved independent of the particular application utilizing the two signals. Therefore, the present invention can be implemented in a variety of applications.

Other features and advantages of the present invention will become apparent to one skilled in the art upon examination of the following drawings in the detailed description. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1A:
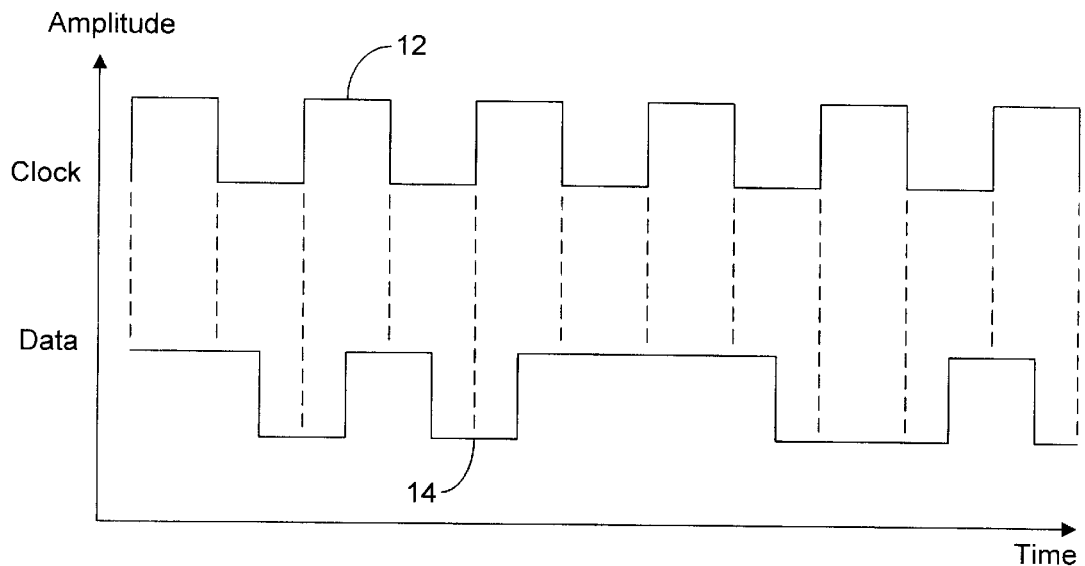
FIG. 1 is an illustrative diagram illustrating the timing relationship of a data signal to a clock signal.

FIG. 1 illustrates the transitions of a clock signal 12 with respect to transitions of a corresponding data signal 14. FIG. 1A depicts an ideal situation where transitions of the clock signal 12 and the data signal 14 occur far enough apart to ensure accurate sampling. In FIG. 1, assume, for illustrative purposes only, that data signal 14 contains two bits of information for each period of clock signal 12 and that data signal 14 is sampled for each transition of clock signal 12 (i.e., data signal 14 is sampled on every rising and falling edge of clock signal 12). As clearly illustrated by the dashed reference lines in FIG. 1A, each clock signal 12 transition occurs approximately in the middle of each data bit of data signal 14. Having the clock signal 12 transition in the middle of each data signal 14 bit is an ideal situation because each data bit center is stable and any small variations in timing are likely to produce very few, if any, errors.

Figure 1B:
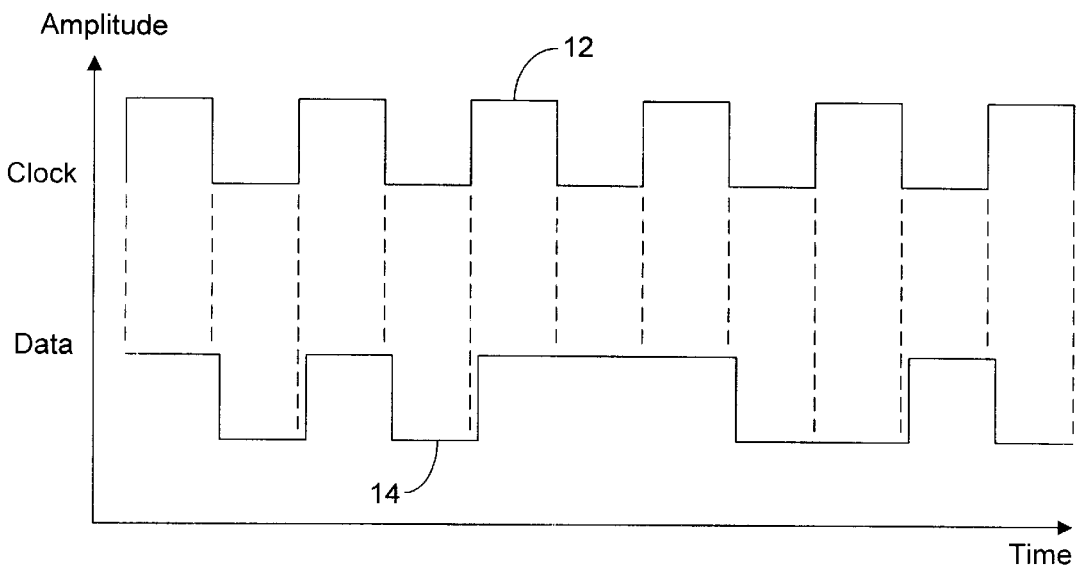

Contrasting FIG. 1A is FIG. 1B which depicts the same clock signal 12 and data signal 14 when the transitioning of the two signals occur too close to one another to ensure reliable sampling. As illustrated by the dashed reference lines in FIG. 1B, the transitions of clock signal 12 occur very close to the start and stop points of each bit in data signal 14. Consequently, any variation in timing could cause a clock signal 12 transition to occur during the wrong data signal 14 bit, thereby causing a sampling of an incorrect data value. Furthermore, as known in the art, there exists a finite amount of transition time for a bit to switch from one state to another (e.g., to switch from a low value to a high value or vice versa). Therefore, by having the clock signal 12 transitions occur close to the data signal 14 transitions, it is possible for the data signal 14 to be sampled during a transition state which yields unreliable results. Accordingly, it is desirable to detect whether a clock signal 12 is transitioning close to a data signal 14 transition so that sampling errors can be handled appropriately.

The present invention provides a signal comparison system and method for improving data analysis by determining when a clock signal 12 is transitioning with respect to a data signal 14. In the preferred embodiment, as illustrated by way of example in FIG. 2, the signal comparison system 20 of the present invention along with its associated methodology is implemented within a computer system 23. Furthermore, computer system 23 is preferably a logic analyzer. As noted in the Background section hereinabove, the signal comparison system 20 is particularly useful in a logic analyzer 21 since logic analyzers 21 typically evaluate an external data signal 14 (FIG. 1) in relation to an external clock signal 12 (FIG. 1) from another digital system. However, the principles of the present invention are not limited for use in logic analyzers 21 and may be implemented in any system where it is desirable to detect transitions of one signal relative to transitions of another signal.

Furthermore, control logic 24 for controlling the features of the signal comparison system 20 can be stored in computer memory 25 of computer system 23. Note that control logic 25 can be stored and transported on any computer-readable medium for use by or in connection with a computer-readable system or method. In the context of this document, a computer-readable medium is an electronic, magnetic, optical, or other physical device or means that can contain or store a computer program for use by or in connection with a computer-related system or method. As an example, the control logic 25 may be magnetically stored and transported on a conventional portable computer diskette.

Figure 2:
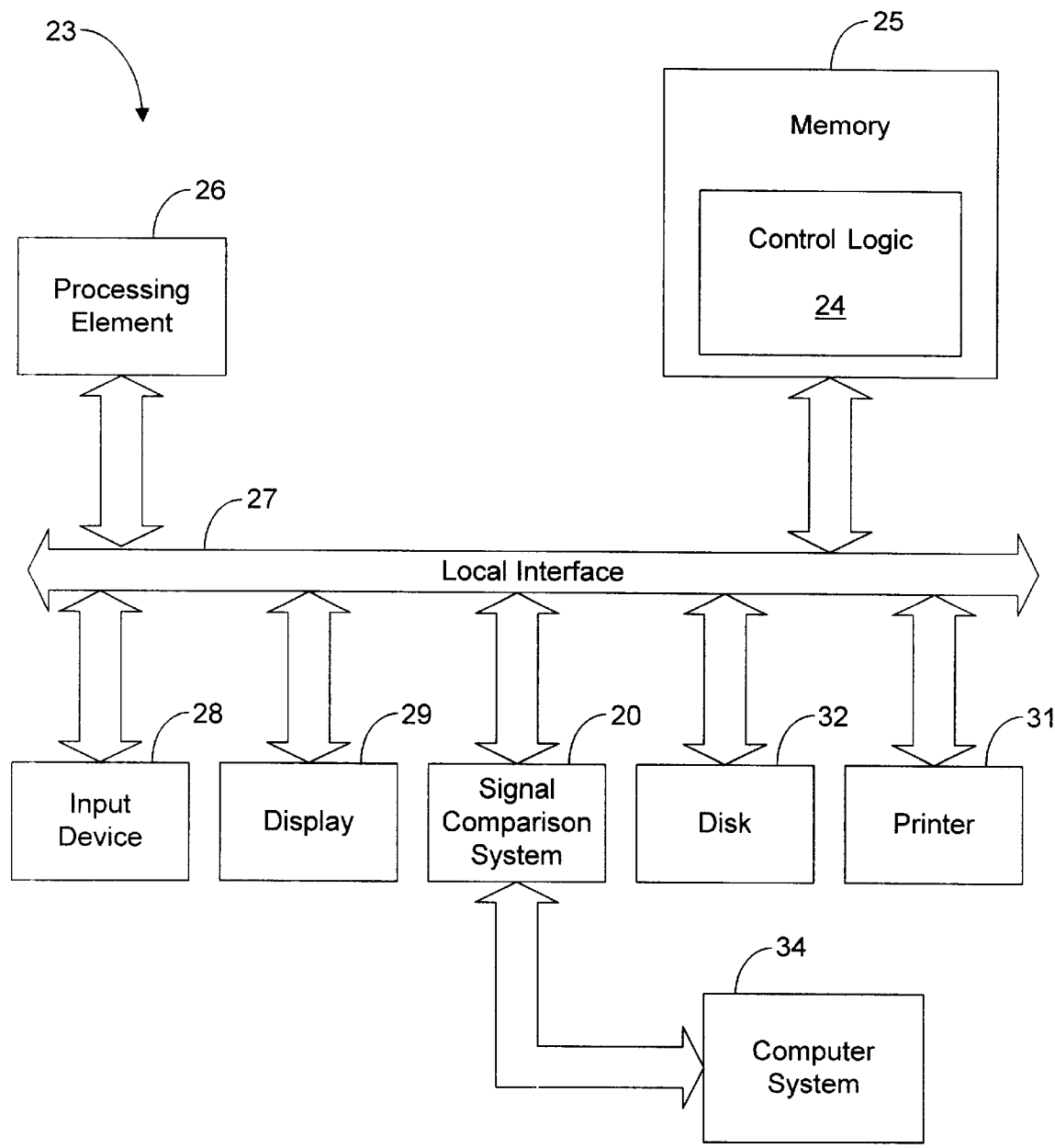
FIG. 2 is a block diagram illustrating a computer system employing a signal comparison system in accordance with the principles of the present invention.

The preferred embodiment of the computer system 23 of FIG. 2 comprises one or more conventional processing elements 26, such as a digital signal processor (DSP), that communicate to and drive the other elements within the system 23 via a local interface 27, which can include one or more buses. Furthermore, an input device 28, for example, a keyboard or a mouse, can be used to input data from a user of the system 23, and screen display 29 or a printer 31 can be used to output data to the user. A disk storage mechanism 32 can be connected to the local interface 27 to transfer data to and from a nonvolatile disk (e.g., magnetic, optical, etc.). The signal comparison system 20 can be connected to another computer system 34. For example, the system 20 can receive the signals 12 and 14 to be analyzed when the system 20 is coupled to the other computer system 34.

First Embodiment

Figure 3:
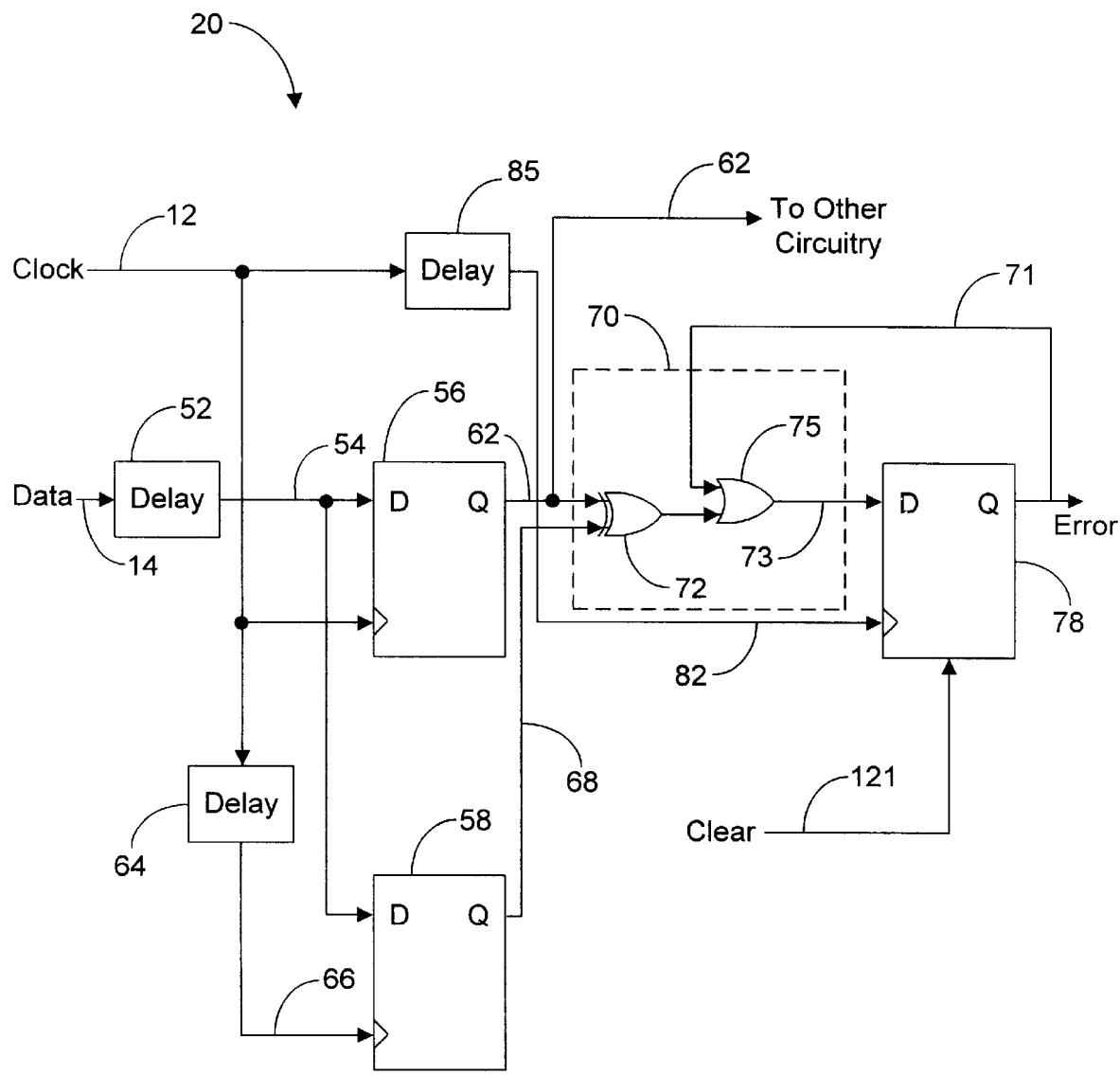
FIG. 3 is a blobk diagram illustrating the signal comparison system of FIG. 2.

FIG. 3 depicts the signal comparison system 20 of the first embodiment of the present invention. A delay mechanism 52 is designed to receive data signal 14 and to output a delayed signal 54. Delay mechanism 52 is configured to delay the data signal 14 an appropriate amount in order to ensure that transitions of delayed data signal 54 are sufficiently separated from transitions of clock signal 12. The operation of delay mechanism 52 will be discussed in further detail hereinbelow.

Latches 56 and 58 are configured to receive delayed signal 54 as data (D) inputs. Latches 56 and 58 can be of any conventional design and, in the preferred embodiment, are conventional flip-flops of any suitable type or model. Latch 56 is designed to receive clock signal 12 as a clock input. Therefore, latch 56 is configured to store the current data value of delayed signal 54 and to transmit the current stored value (Q) in latch 56 as signal 62 when a transition of clock signal 12 is detected. Signal 62 is designed to be received by a comparison mechanism 70 and by other circuitry in logic analyzer 21 (FIG. 2) which processes the data value through techniques known in the art for performing the functionality of logic analyzer 21. Therefore, signal 62 corresponds to a sampled data value of delayed data signal 54.

Delay mechanism 64 is designed to receive the clock signal 12. Delay mechanism 64 is configured to delay clock signal 12 and to output the clock signal 12 in delayed form as a delayed clock signal 66. The amount of delay may depend on many other factors but should at least correspond to a sufficient amount of time for the data value of latch 56 to stabilize after a change in state of delayed data signal 54 is latched into latch 56. Once latch 58 detects a transition of delayed clock signal 66, latch 58 is designed to store the current value of delayed signal 54 and to transmit the current stored data value of latch 58 as signal 68 which is received by comparison mechanism 70.

Comparison mechanism 70 is configured to compare signal 62 and signal 68 and to output a signal 73 having particular logical value when signal 62 and signal 68 differ. For example, in the preferred embodiment, comparison mechanism 70 is preferably configured to transmit a logical high value when signal 62 and signal 68 differ. Furthermore, comparison mechanism 70 is preferably configured to analyze a feedback signal 71 and to output the particular logical value mentioned hereinabove when signal 71 indicates a particular state by having a value corresponding to the particular logical value of signal 73. Feedback signal 71 will be discussed further hereinbelow. Therefore, comparison mechanism 70 is preferably designed to output a logical high value when either signal 62 and signal 68 differ or when signal 71 has a value corresponding to the high logical value of signal 73.

Comparison mechanism 70 preferably includes an exclusive-or gate 72 and an or gate 75. Exclusive-or gate 72 is designed to compare signal 62 and signal 68 according to principles well established in the prior art. Therefore, exclusive-or gate 72 is preferably designed to output a high logical value only when signal 62 corresponds to a different value than the data value of signal 68. Otherwise, exclusive-or gate 72 is designed to output a low logical value.

Or gate 75 is configured to receive the output of exclusive-or gate 72 and to receive feedback signal 71 from a latch 78. Preferably, feedback signal 71 is designed to indicate a high logical value when latch 78 has previously detected a high logical value from comparison mechanism 70. Or gate 75 is configured to analyze the output of exclusive-or gate 72 and feedback signal 71 according to principles well established in the prior art. Therefore, or gate 75 is designed to output a logical high value when either the output of exclusive-or gate 72 or feedback signal 71 corresponds to a logical high value.

Latch 78 is configured to receive a delayed clock signal 82 from a delay mechanism 85. Latch 78 is further configured to output the data value of stored in latch 78 as feedback signal 71 and to store the output of comparison mechanism 70 when latch 78 detects a transition in delayed clock signal 82.

Delay mechanism 85 is configured to delay clock signal 12 an appropriate amount and to output the clock signal 12 in delayed form as delayed clock signal 82. The amount of appropriate delay may depend on many other factors but should at least correspond to enough time to ensure that latch 78 has been successfully updated for a transition in current clock signal 12. Therefore, the amount of delay in delay mechanism 85 should at least correspond to the delay time of delay mechanism 64 plus an amount of time for signal 68 to be latched out of latch 58 and to pass through gates 72 and 75 to latch 78 plus an amount of time for a transition of the data value stored within latch 78 to stabilize.

Figure 4:
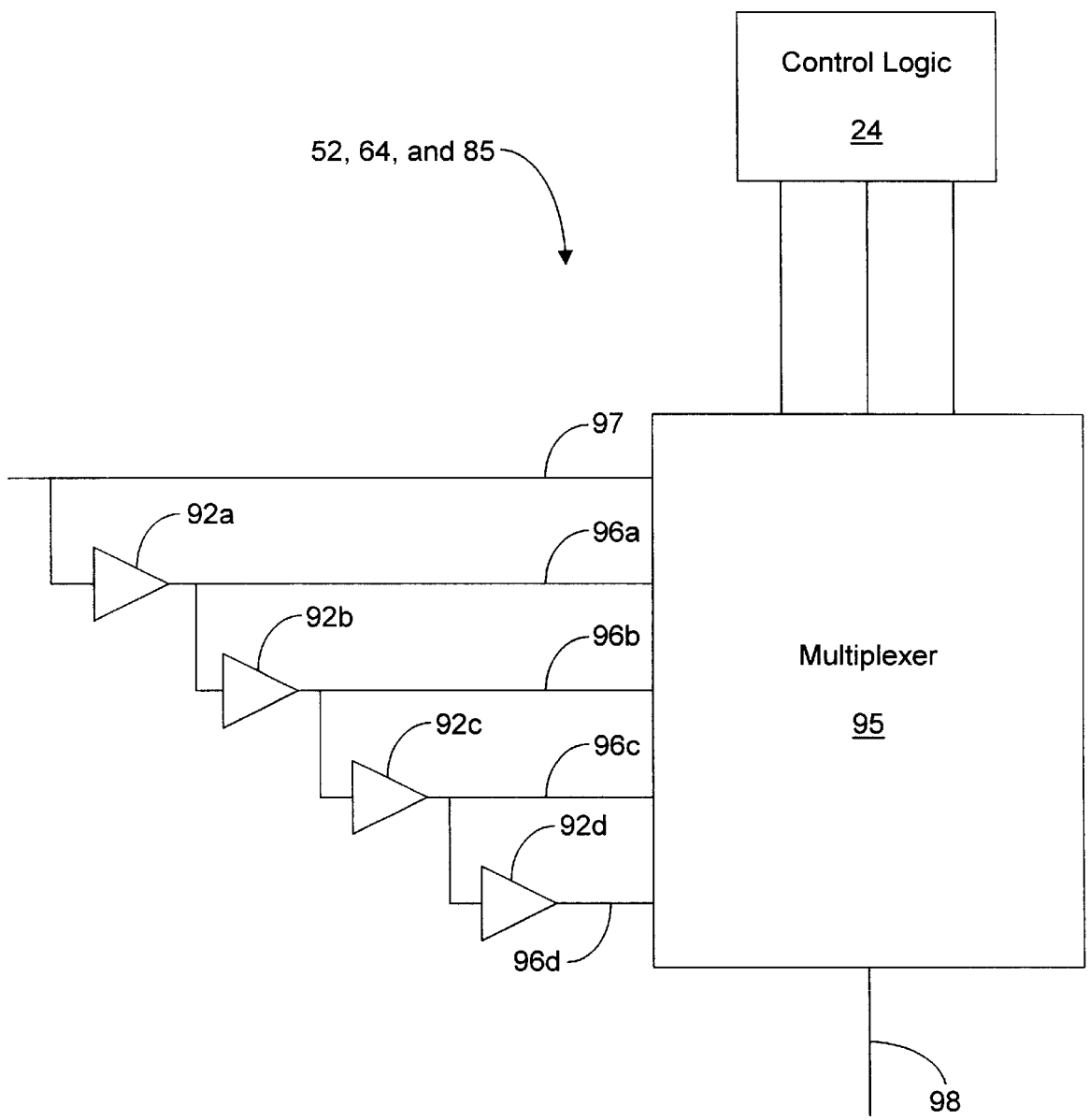
FIG. 4 is a block diagram illustrating the delays mechanisms of FIG. 3.

Delay mechanisms 52, 64 and 85 can be of any conventional design to achieve the functionality of delaying a signal a desired amount of time. FIG. 4 depicts an example of a possible configuration of delay mechanisms 52, 64 and 85. Each delay mechanism 52, 64 and 85 is preferably configured to include a plurality of buffers 92 coupled to a multiplexer 95 by a plurality of connections 96. Delay mechanisms 52, 64 and 85 are designed to receive the signal to be delayed 12 or 14 (FIG. 3) on connection 97. The signals on connection 97 are designed to pass through each buffer 92 to multiplexer 95. As known in the art, multiplexer 95 is of a conventional design which outputs one of the signals on connections 96a, 96b, 96c, 96d or 97 across an output connection 98.

Control logic 24 is designed to provide control signals to mulitplexer 95 to instruct multiplexer 95 on which connection 96a, 96b, 96c, 96d or 97 to select. As known in the art, each buffer 92a, 92b, 92c and 92d delays a signal by a finite amount of time. Therefore, a signal on connection 97 is not delayed while each signal on each connection 96 is delayed an amount of time corresponding to a number of buffers 92 that the signal passes through. The more buffers 92 that a signal passes through, the longer the signal is delayed. Therefore, the delay time of delay mechanism 52, 64 and 85 can be altered by changing which connection 96a, 96b, 96c, 96d, or 97 provides the input to multiplexer 95.

Second Embodiment

Figure 5:
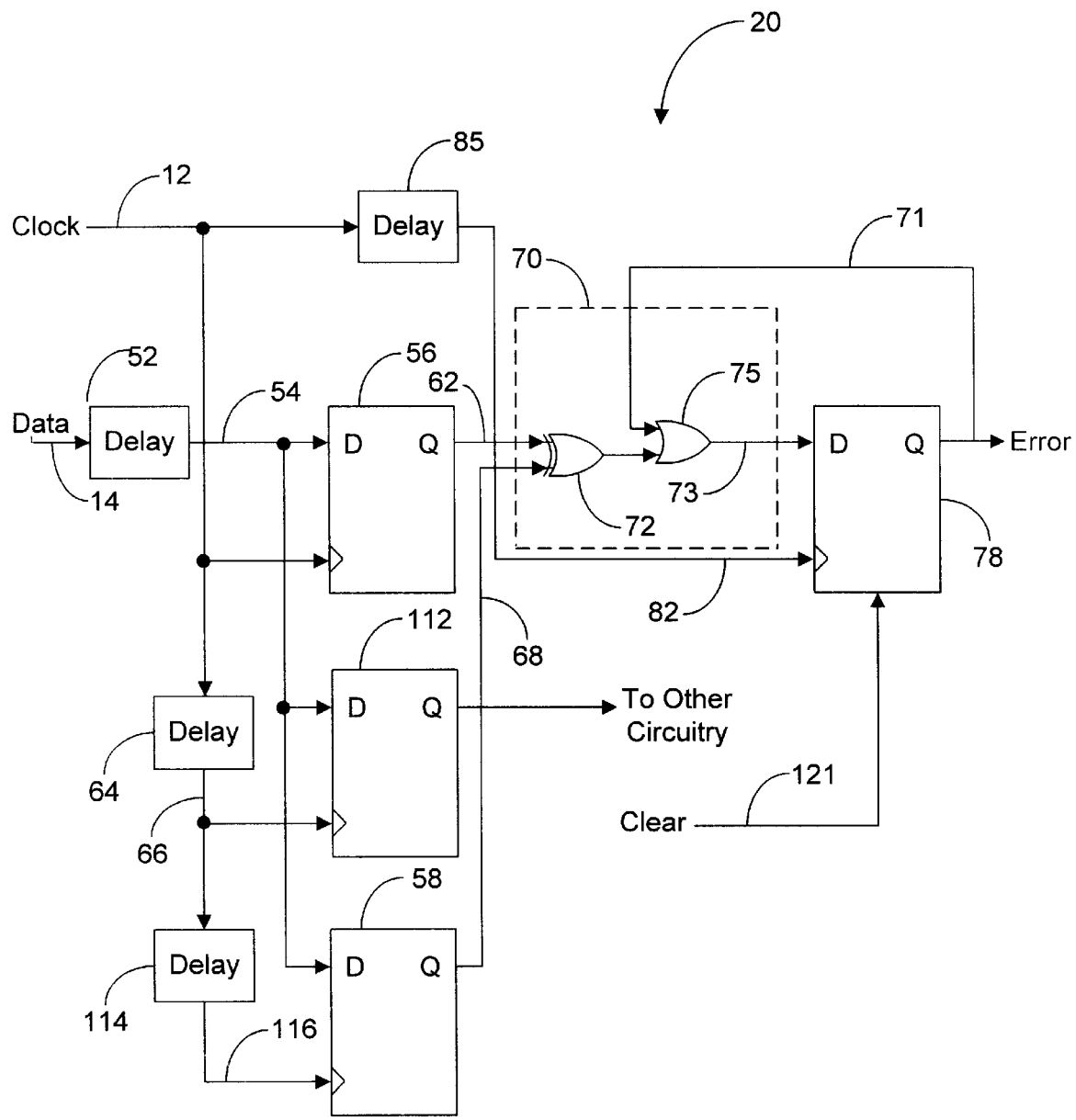
FIG. 5 is a block diagram illustrating the second embodiment of the signal comparison system of FIG. 2.

The second embodiment of the present invention is depicted in FIG. 5. The architecture of the second embodiment is similar to that of the first embodiment except that, for example, a latch 112 and a delay mechanism 114 have been added. Latch 112 is configured to receive delayed data signal 54 as a data input. Furthermore, instead of latch 58 receiving delayed clock signal 66 from delay mechanism 64, latch 112 is designed to receive delayed clock signal 66. Latch 112 is further designed to store the current value of delayed data signal 54 and to output the current data value stored in latch 112 when latch 112 detects a transition from delayed clock signal 66. The signal output from latch 112 is transmitted to other circuitry within logic analyzer 21 for further processing through techniques known in the art. Note that latch 112 is designed to provide a sample of delayed data signal 54 to the other circuitry in logic analyzer 21 instead of latch 56 which provides the sampled signal in the first embodiment.

As in the first embodiment, delay mechanism 64 is designed to delay clock signal 12 an amount of time sufficient to enable the data value clocked into latch 56 to stabilize. Furthermore, delay mechanism 114 is designed to delay the delayed clock signal 66 and to output the clock signal 12 in another delayed form as delayed clock signal 116. The amount of delay associated with delay mechanism 114 should correspond to a sufficient amount of time to allow at least a transitioned data value in latch 112 to stabilize plus the delay time of delay mechanism 64.

OPERATION

The preferred use and operation of the signal comparison system 20 and associated methodology are described hereafter.

First Embodiment

Referring to FIG. 3, the signal comparison system 20 receives clock signal 12 and data signal 14. As previously noted, signal comparison system 20 preferably resides in a computer system 23 which is used to analyze data signal 14. In this regard, computer system 23 is defined as a logic analyzer. Accordingly, signal comparison system 20 preferably receives, via system interface 33, the clock signal 12 and the data signal 14 from an external source (e.g., computer system 34) under analysis by the computer system 23 (FIG. 2).

Once received by the signal comparison system, data signal 14 passes through delay mechanism 52 to latches 56 and 58. As will be discussed in further detail hereinbelow, delay mechanism 52 delays the data signal 14 and outputs a delayed form of data signal 14 as delayed data signal 54. Initially, delay mechanism 52 can delay the data signal 14 any amount of time including a delay time of zero which allows the data signal 14 to freely pass. The data value of delayed data signal 54 is clocked into latch 56 by a transition of the clock signal 12.

The clock signal 12 is delayed by delay mechanism 64 a sufficient amount of time to allow at least the data value clocked into latch 56 to settle. The term "settle" refers to herein as reaching a stable data state. After the data value clocked into latch 56 has stabilized, the transition in data clock signal 12 passes out of delay mechanism 64 and into latch 58 as delayed clock signal 66. Latch 58 responds to the transition in order to latch the current data value of delayed data signal 54 into latch 58.

As long as the delayed data signal 54 does not transition between the time the data value of delayed signal 54 is stored into latch 56 and the time it is stored into latch 58, the data values stored in latches 56 and 58 should match. However, if the delayed data signal 54 switched state between the transitions of signals 12 and 66 received by latches 56 and 58, respectively, then the data values of latches 56 and 58 should differ.

When the values of latches 56 and 58 are latched out by the next transition of clock signal 12 and delayed clock signal 66, respectively, the exclusive-or gate 72 in comparison mechanism 70 outputs a high logical value only if the values stored in latches 56 and 58 differ. Therefore, exclusive-or gate 72 only outputs a logical high value when the delayed data signal 54 switches state between the latching of the delayed data signal 54 into latch 56 and the latching of the delayed data signal 54 into latch 58. As a result, a high logical value output from exclusive-or gate 72 indicates that the delayed data signal 54 transitioned so close to a transition of clock signal 12 that the data value stored in latch 56 may be unreliable.

A high logical value from exclusive-or gate 72 forces the or gate 75 to output a high logical value as signal 73. After the or gate outputs signal 73, a transition of clock signal 12 is passed out of delay mechanism 85 and into latch 78 as delayed clock signal 82. If signal 73 is a logical high value, then the data value stored in latch 78 becomes a logical high value as well, and, upon the next delayed clock signal 82 transition, latch 78 transmits the logical high value stored in latch 78 to or gate 75. This forces or gate 75 to output a logical high value again. Therefore, once the value of latch 78 goes to a logical high value, it remains as a logical high value until the latch 78 is reset by a clear signal 121.

Consequently, the value stored in latch 78 should be a logical low value until delayed data signal 54 transitions close to a transition of clock signal 12, thereby forcing comparison mechanism 70 to output a logical high value as described hereinabove. Once this occurs, the value stored in latch 78 transitions to a logical high value that remains a logical high value due to feedback signal 71 and or gate 75 until the latch is reset by clear signal 121. Accordingly, latch 78 operates as a status indicator where a logical low value in latch 78 indicates that no timing errors have been detected since the last transmission of clear signal 121 and where a logical high value in latch 78 indicates that a timing error may have occurred since the last transmission of clear signal 121.

In order to determine whether timing errors may be occurring, control logic 24 (FIG. 2) periodically checks the value of latch 78 by reading signal 71. If signal 71 is high, then it is known that timing errors are possibly occurring and that the data from signal 62 is unreliable because the delayed data signal 54 is transitioning too close to the clock signal 12. Control logic 24 (FIG. 2) and signal comparison system 20 preferably use this information to implement the methodology of FIG. 6.

Figure 6:
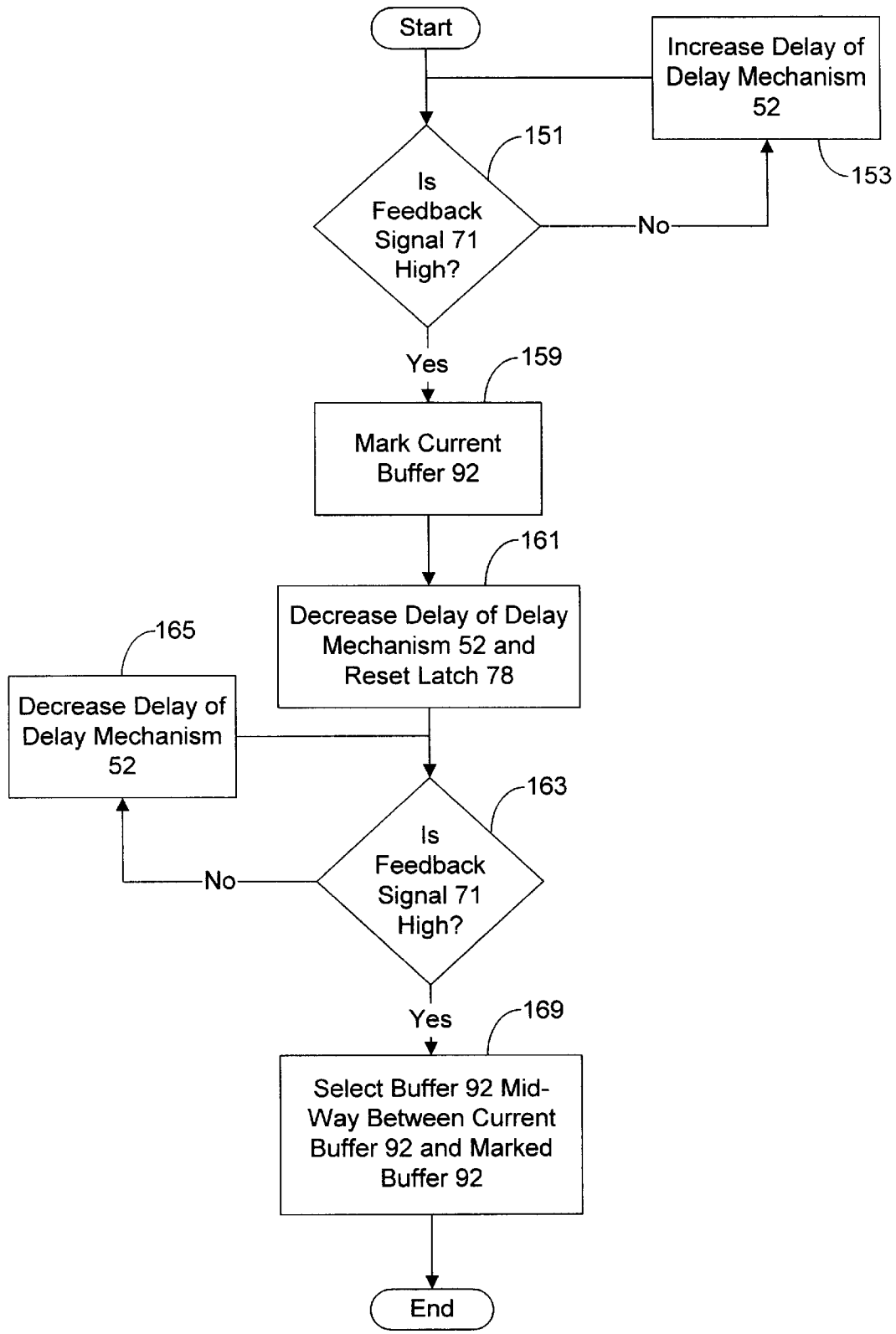
FIG. 6 is a flow chart illustrating the operation and functionality of the signal comparison system in combination with its associated control logic, both of FIG. 2.

FIG. 6 depicts a methodology that can be implemented in order to ensure that the position of clock signal 12 transistions occur in the middle of the data bits of delayed data signal 54 as depicted in FIG. 1A. Referring to FIGS. 3 and 6 wherein FIG. 6 depicts the functionality of the control logic 24 (FIG. 2) and the signal comparison system 20, control logic 24 (FIG. 2) initially checks the value of feedback signal 71 in block 151. If feedback signal 71 is not a logical high, then control logic 24 provides control signals to multiplexer 95 (FIG. 4) within delay mechanism 52 in order to increase the delay time of delay mechanism 52 as depicted by block 153. For example, assuming that multiplexer 95 of delay mechanism 52 is currently outputting signals from connection 97, the control logic 24 (FIG. 2), in implementing block 153, causes multiplexer 95 to output signals on connection 96a instead.

Referring again to FIGS. 3 and 6, feedback signal 71 is again checked for a high logical value after a long enough period has expired to allow at least one data bit of delayed data signal 54 to switch states during the routine course of transmitting data signal 14. As shown by blocks 151 and 153, the process of increasing the delay time of delay mechanism 52 is continued until a high logical value is detected on feedback signal 71. At this point, the clock signal 12 is transitioning close to transitions of the delayed data signal 54.

As depicted by block 159, a value corresponding to the connection 96 (FIG. 4) currently accessed by mulitplexer 95 (FIG. 4) of delay mechanism 52 is stored in memory 25 (FIG. 2). Control logic 24 (FIG. 2) then decreases the delay time of delay mechanism 52 by causing multiplexer 95 (FIG. 4) of delay mechanism 52 to access a different connection 96 or 97 (FIG. 4) as depicted by block 161 of FIG. 6.

Also depicted in block 161, latch 78 is reset by transmitting clear signal 121 to latch 78. The feedback signal 71 is then checked for a high logical value in block 163. If feedback signal 71 does not correspond to a high logical value, then control logic 24 (FIG. 2) decreases the delay time using similar techniques as those described hereinabove for block 153 except that the number of buffers 92 passed through by the signal on the accessed connection 96 or 97 decreases. As depicted by blocks 163 and 165, the process of decreasing the delay time of delay mechanism 52 is continued until feedback signal 71 corresponds to a high logical value. At this point, the delayed data signal 54 is again transitioning close to the transitions of clock signal 12. Furthermore, control logic 24 (FIG. 2) now has enough information to set the timing of the delayed data signal 54 to the ideal situation depicted in FIG. 1A (i.e., where the clock signal 12 is transitioning in the middle of the bits of the sampled data signal 14).

In this regard, control logic 24 (FIG. 2), in block 169, provides control signals to multiplexer 95 (FIG. 4) of delay mechanism 52 in order to cause the multiplexer 95 to select the connection 96 or 97 that is half-way in between the connection 96 (FIG. 4) currently accessed by the multiplexer 95 of delay mechanism 52 and the connection 96 marked in memory 25 (FIG. 2). For example, assume that in FIG. 4 connection 96d was accessed by the multiplexer when a high logical value was detected in block 151 and connection 97 was accessed when a logical high value was detected in block 163. In order to cause the transitions of clock signal 12 to occur in the middle of the data bits of delayed data signal 54 as depicted in FIG. 1A, control logic 24 (FIG. 2) instructs multiplexer 95 (FIG. 4) of delay mechanism 52 to select connection 96b which is half-way between connections 96d and 97. By doing so, the timing errors caused by delayed data signal 54 transitioning too close to the transitions of clock signal 12 are significantly reduced, if not eliminated.

Second Embodiment

The operation of the second embodiment of the present invention is similar to that of the first embodiment. Referring to FIG. 5, as in the first embodiment, delayed data signal 54 is latched into latch 56 by a transition of clock signal 12. After delay mechanism 64 delays clock signal 12 by a sufficient amount of time to allow the data latched into latch 56 to stabilize, latch 112 stores the current value of delayed data signal 54 into latch 112 in response to the delayed transition from delayed clock signal 66. After delay mechanism 114 delays delayed clock signal 66 by a sufficient amount of time to allow the data latched into latch 112 to stabilize, latch 58 stores the current value of delayed data signal 54 into latch 58 in response to the delayed transition from delayed clock signal 116.

The sampled data used by other circuitry within logical analyzer 21 is supplied by latch 112 in response to the next transition in delayed clock signal 66. This is contrary to the first embodiment wherein latch 56 provides the sampled data. As in the first embodiment, latch 78 only outputs a high logical value as feedback signal 71 when the data value within latch 56 differs from the data value within latch 58 after the two latches 56 and 58 have been clocked by corresponding clock signals 12 and 116.

Therefore, if the signal comparison system 20 does not detect a delayed data signal 54 transition between the clock transitions of latches 56 and 58, then the data of latch 112 is presumed valid since the data was stored into latch 112 between the clocking of latches 56 and 58. Accordingly, the first embodiment and the second embodiment of the signal comparison system 20 both allow the detection of a transition of delayed data signal 54 within a certain time period of a transition of a clock signal 12. However, the circuit of the first embodiment performs this functionality with a minimum number of components and with shorter processing time. Therefore, the first embodiment is the preferred embodiment of the present invention.

The present invention assumes that delayed data signal 54 is sampled for each transition of clock signal 12 (i.e., for each rising edge and falling edge of clock signal 12). However, as known in the art, data can be sampled according to various states of the clock signal 12. It should be apparent to one ordinarily skilled in the art that the sampling rate of delayed data signal 54 with respect to clock signal 12 can be altered without departing from the principles of the present invention.

In concluding the detailed description, it should be noted that it will be obvious to those skilled in the art that many other variations and modifications may be made to the preferred embodiment without substantially departing from the principles of the present invention. All such variations and modifications are intended to be included herein within the scope of the present invention, as set forth in the following claims.

Now, therefore, the following is claimed:

1. A system for detecting timing errors between clock signals and data signals, comprising:

a first latch responsive to a transition of a clock signal for transmitting a first data value of a data signal;

a second latch responsive to said transition of said clock signal for transmitting a second data value of said data signal;

a first delay mechanism configured to receive said clock signal and to transmit said clock signal to said second latch, said first delay mechanism configured to delay said clock signal by a first delay period;

a comparison mechanism configured to compare said first data value to said second data value and to transmit a first particular logical value when said first data value differs from said second data value;

circuitry coupled to said comparison mechanism, said circuitry configured to detect a timing error in response to said particular logical value, wherein said first particular logical value indicates that a transition of said data signal occurred between a reception of said transition of said clock signal by said first latch and a reception of said transition of said clock signal by said second latch.

2. The system of claim 1, wherein said first delay period corresponds to an amount of time for said first data value to stabilize.

3. The system of claim 1, wherein said system is included within a logic analyzer.

4. The system of claim 1, wherein said first particular logical value indicates that said first data value is unreliable.

5. The system of claim 1, further comprising;

a second delay mechanism configured to receive said data signal and to transmit said data signal to said first and second latches, said second delay mechanism configured to delay said data signal by a second delay period; and control logic configured to adjust said second delay period in response to said first particular logical value.

6. The system of claim 5, wherein said control logic is further configured to:
  (a) increase said second delay period to an increased second delay period wherein said control logic determines that said particular logical value is produced by said comparison mechanism when said second delay mechanism delays said data signal by said increased second delay period,
  (b) decrease said second delay period to a decreased second delay period wherein said control logic determines that said particular logical is produced by said comparison mechanism when said second delay mechanism delays said data signal by said decreased second delay period; and
  (c) cause said second delay mechanism to delay said data signal between said increased second delay period and said decreased second delay period based on said increased and decreased second delay periods determined by said control logic.

7. The system of claim 6, wherein said time value corresponds to approximately one-half of a difference of said first time value and said second time value.

8. A system, comprising:
  a first latch responsive to a transition of a first signal for transmitting a first data value of a data signal;
  a second latch responsive to a transition of a second signal for transmitting a second data value of said data signal;
  a first delay mechanism configured to receive said first signal and subsequently to transmit said second signal after a first delay period;
  a comparison mechanism configured to compare said first data value to said second data value and to transmit a first particular logical value when said first data value differs from said second data value; and
  a status indicator responsive to said first particular logical value for transmitting a feedback signal having a value corresponding to said first particular logical value,
  wherein said comparison mechanism is further configured to transmit said first particular logical value in response to said feedback signal, and wherein said first particular logical value indicates that a transition of said data signal occurred between said transition of said first signal and said transition of said second signal.

9. The system of claim 8, wherein said status indicator is a third latch configured to receive said first particular logical value, said third latch responsive to a third signal for transmitting a logical value received from said comparison mechanism.

10. The system of claim 9, further comprising a second delay mechanism configured to receive said first signal and to transmit said third signal after a second delay period wherein said second delay period is associated with a reception of said first signal by said second delay mechanism.

11. The system of claim 10, wherein said second delay period corresponds to said first delay period, to a propagation time of said comparison mechanism, and to an amount of time for said logical value received from said comparison mechanism to stabilize within said third latch.

12. The system of claim 8, wherein said comparison mechanism further comprises:
  an exclusive-or gate configured to compare said first data value to said second data value and to transmit a comparison signal having a value corresponding to said first particular logical value when said first data value differs from said second data value and having a value corresponding to a second particular logical value when said first data value corresponds to said second data value; and
  an or gate configured to receive said feedback signal and said comparison signal and to transmit said first particular logical value when either said feedback signal or said comparison signal corresponds to said first particular logical value.

13. The system of claim 12, wherein said status indicator continuously transmits said feedback signal until said status indicator receives a clear signal.

14. The system of claim 12, wherein said first particular logical value is a logical one and said second particular logical value is a logical zero.

15. The system of claim 12, wherein said first signal is a clock signal.

16. A system for detecting timing errors between clock signals and data signals, comprising:
  means for delaying a transition of a clock signal;
  means for receiving said clock signal and for transmitting a first data value of a data signal in response to a transition of said clock signal;
  means for receiving said clock signal from said delaying means and for transmitting a second data value of said data signal in response to said transition of said clock signal;
  means for comparing said first data value to said second data value;
  means for transmitting a particular logical value when said first data value differs from said second data value; and
  means for detecting a timing error in response to said particular logical value.

17. The system of claim 16, wherein said particular logical value indicates that said first data value is unreliable.

18. The system of claim 16, wherein said delaying means ensures that said first data value becomes stable before said second data value is transmitted by said transmitting a second data value means.

19. The system of claim 16, further comprising:
  means for increasing a delay time associated with said delaying means;
  means for determining an increased delay time used to delay a transition of said clock signal when said particular logical value is transmitted by said transmitting means;
  means for decreasing said delay time associated with said delaying means;
  means for determining a decreased delay time used to delay a transition of said clock signal when said particular logical value is transmitted by said transmitting means; and
  means for adjusting said delay time associated with said delaying means so that said delay time is defined by a time between said decreased delay time and said increased delay time in order to reduce errors associated with said first data value.

20. The system of claim 19, wherein said time between said decreased delay time and said increased delay time corresponds to approximately one-half of the difference of said decreased delay time and said increased delay time.

21. A system for determining timing errors, comprising:
  means for sampling a first signal in response to a transition of a second signal to produce a first sampled value;

means for sampling said first signal in response to a delayed transition of said second signal to produce a second sampled value;

means for comparing said first sampled value to said second sampled value; and means for indicating that said first data value is unreliable when said first sampled value differs from said second sampled value.

22. A method for detecting timing errors between clock signals and data signals, comprising the steps of:

delaying a transition of a clock signal;

receiving said clock signal prior to said delaying step and transmitting a first data value of a data signal in response to said transition of said clock signal;

receiving said clock signal subsequent to said delaying step and transmitting a second data value of said data signal in response to said transition of said clock signal;

comparing said first data value to said second data value;

transmitting a particular logical value when said first data value differs from said second data value; and detecting a timing error in response to said particular logical value.

23. The method of claim 22, wherein said particular logical value indicates that said first data value is unreliable.

24. The method of claim 22, wherein said delaying step ensures that said first data value becomes stable before said transmitting a second data value step.

25. The method of claim 22, further comprising the steps of:

determining an increased delay time used to delay a transition of said data signal when a timing error is detected;

determining an increased delay time used to delay a transition of said data signal when a timing error is detected; and adjusting, based on said determining steps, a delay time used to delay said data signal so that said delay time is defined by a time between said decreased delay time and said increased delay time in order to reduce timing errors.

26. The method of claim 25, wherein said time between said decreased delay time and said increased delay time corresponds to approximately one-half of the difference of said decreased delay time and said increased delay time.

27. The method of claim 22, further comprising the steps of:

delaying another transition of said clock signal for a delay period; and selecting said delay period based on said particular logical value transmitted in said transmitting a particular logical value step.

28. The method of claim 22, further comprising the steps of:

delaying a transition of said data signal for a delay period; and selecting said delay period based on said particular logical value transmitted in said transmitting a particular logical value step.

29. A method for detecting timing errors, comprising the steps of:

sampling a first signal in response to a transition of a second signal to produce a first sampled value;

sampling said first signal in response to a delayed transition of said second signal to produce a second sampled value;

comparing said first sampled value to said second sampled value; and indicating that said first data value is unreliable when said first sampled value differs from said second sampled value.

* * * * *